(12) United States Patent
Trimberger (10) Patent No.: US 7,412,635 B1
(45) Date of Patent: Aug. 12, 2008

(54) UTILIZING MULTIPLE BITSTREAMS TO AVOID LOCALIZED DEFECTS IN PARTIALLY DEFECTIVE PROGRAMMABLE INTEGRATED CIRCUITS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 477 days.

(21) Appl. No.: 10/956,986

(22) Filed: Oct. 1, 2004

(51) Int. Cl.
G01R 31/28 (2006.01)

(52) U.S. Cl. .......................... 714/725; 326/23; 326/41; 365/189.04; 716/16

(58) Field of Classification Search ....................... None
See application file for complete search history.

(56) References Cited

U.S. PATENT DOCUMENTS

| | | | |
|---|---|---|---|
| 4,899,067 A | 2/1990 | So et al. | |
| 5,153,880 A | 10/1992 | Owen et al. | |
| 5,255,227 A | 10/1993 | Haeffele | |
| 5,349,248 A | 9/1994 | Goetting et al. | |
| 5,430,734 A * | 7/1995 | Gilson | 714/725 |
| 5,434,514 A | 7/1995 | Cliff et al. | |
| 5,459,342 A | 10/1995 | Nogami et al. | |
| 5,485,102 A | 1/1996 | Cliff et al. | |
| 5,498,975 A | 3/1996 | Cliff et al. | |
| 5,513,144 A | 4/1996 | O'Toole | |
| 5,592,102 A | 1/1997 | Lane et al. | |
| 5,689,516 A * | 11/1997 | Mack et al. | 714/725 |
| 5,742,556 A | 4/1998 | Tavrow et al. | |
| 5,761,483 A | 6/1998 | Trimberger | |
| 5,764,577 A | 6/1998 | Johnston et al. | |
| 5,777,887 A | 7/1998 | Marple et al. | |
| 5,796,750 A * | 8/1998 | Lottridge et al. | 714/725 |
| 5,925,920 A | 7/1999 | MacArthur et al. | |
| 5,931,959 A * | 8/1999 | Kwiat | 714/48 |
| 6,003,150 A * | 12/1999 | Stroud et al. | 714/725 |
| 6,107,821 A * | 8/2000 | Kelem et al. | 326/38 |
| 6,166,559 A | 12/2000 | McClintock et al. | |
| 6,167,558 A | 12/2000 | Trimberger | |
| 6,201,404 B1 | 3/2001 | Reddy et al. | |

(Continued)

OTHER PUBLICATIONS

U.S. Appl. No. 10/956,556, filed Oct. 1, 2004, Trimberger.

(Continued)

*Primary Examiner*—Jacques Louis-Jacques
*Assistant Examiner*—Guerrier Merant
(74) *Attorney, Agent, or Firm*—Lois D. Cartier; LeRoy D. Maunu (57) ABSTRACT

Methods and structures utilizing multiple configuration bitstreams to program integrated circuits (ICs) such as programmable logic devices (PLDs), thereby enabling the utilization of partially defective ICs. A user design is implemented two or more times, preferably utilizing different programmable resources as much as possible in each configuration bitstream. The resulting configuration bitstreams are stored in a memory device such as a programmable read-only memory (PROM). Under the control of a configuration control circuit or device, the various bitstreams are sequentially loaded into a partially defective IC and tested using an automated testing procedure. When a bitstream is found that enables the design to function correctly in the programmed IC, i.e., that avoids the defective programmable resources in the IC, the automated testing procedure terminates, and the programmed IC begins to function according to the user design as determined by the last programmed bitstream.

24 Claims, 7 Drawing Sheets

U.S. PATENT DOCUMENTS

| | | | |
|---|---|---|---|
| 6,202,182 B1* | 3/2001 | Abramovici et al. | 714/725 |
| 6,247,147 B1* | 6/2001 | Beenstra et al. | 714/39 |
| 6,279,146 B1* | 8/2001 | Evans et al. | 716/18 |
| 6,289,292 B1 | 9/2001 | Charlton et al. | |
| 6,292,925 B1 | 9/2001 | Dellinger et al. | |
| 6,311,316 B1 | 10/2001 | Huggins et al. | |
| 6,344,755 B1 | 2/2002 | Reddy et al. | |
| 6,496,971 B1 | 12/2002 | Lesea et al. | |
| 6,530,071 B1 | 3/2003 | Guccione et al. | |
| 6,560,740 B1 | 5/2003 | Zuraski, Jr. et al. | |
| 6,594,610 B1* | 7/2003 | Toutounchi et al. | 702/117 |
| 6,618,686 B2* | 9/2003 | Allamsetty | 702/120 |
| 6,664,808 B2 | 12/2003 | Ling et al. | |
| 6,668,237 B1* | 12/2003 | Guccione et al. | 702/119 |
| 6,681,353 B1* | 1/2004 | Barrow | 714/725 |
| 6,704,889 B2* | 3/2004 | Veenstra et al. | 714/39 |
| 6,725,442 B1 | 4/2004 | Cote et al. | |
| 6,744,274 B1* | 6/2004 | Arnold et al. | 326/16 |
| 6,779,133 B2* | 8/2004 | Whetsel | 714/28 |
| 6,864,710 B1* | 3/2005 | Lacey et al. | 326/39 |
| 6,915,503 B1 | 7/2005 | Lesea | |
| 6,918,027 B2* | 7/2005 | Mantey et al. | 712/37 |
| 6,925,407 B2* | 8/2005 | Duppong | 702/119 |
| 6,961,884 B1* | 11/2005 | Draper | 714/726 |
| 6,973,608 B1* | 12/2005 | Abramovici et al. | 714/725 |
| 7,007,250 B1 | 2/2006 | Bapat et al. | |
| 7,071,679 B1* | 7/2006 | Sabih et al. | 324/158.1 |
| 7,080,300 B1* | 7/2006 | Herron et al. | 714/726 |
| 7,127,697 B1 | 10/2006 | Wells et al. | |
| 7,133,822 B1* | 11/2006 | Jacobson | 703/28 |
| 7,146,598 B2* | 12/2006 | Horanzy | 716/16 |
| 7,185,293 B1* | 2/2007 | Ofer | 716/1 |
| 7,216,277 B1* | 5/2007 | Ngai et al. | 714/733 |
| 2001/0037458 A1 | 11/2001 | Kean | |
| 2003/0078752 A1* | 4/2003 | Allamsetty | 702/120 |
| 2003/0097551 A1* | 5/2003 | Fuller et al. | 713/1 |
| 2003/0122578 A1* | 7/2003 | Masui et al. | 326/39 |
| 2003/0212940 A1* | 11/2003 | Wong | 714/725 |
| 2003/0225955 A1* | 12/2003 | Feldstein et al. | 710/306 |
| 2004/0010739 A1* | 1/2004 | Odom et al. | 714/724 |
| 2004/0138845 A1* | 7/2004 | Park et al. | 702/108 |
| 2004/0193979 A1* | 9/2004 | Avery et al. | 714/724 |
| 2004/0193980 A1* | 9/2004 | Avery et al. | 714/724 |
| 2005/0050393 A1* | 3/2005 | Chakraborty et al. | 714/30 |
| 2005/0125512 A1* | 6/2005 | Fuller et al. | 709/220 |
| 2005/0177251 A1* | 8/2005 | Duppong | 700/2 |
| 2005/0245098 A1* | 11/2005 | Cooney et al. | 438/781 |
| 2005/0246520 A1 | 11/2005 | Vaid et al. | |
| 2006/0253266 A1* | 11/2006 | Ong | 702/59 |
| 2006/0259871 A1* | 11/2006 | Washington et al. | 715/763 |
| 2006/0282733 A1* | 12/2006 | Whetsel | 714/741 |

OTHER PUBLICATIONS

U.S. Appl. No. 10/956,990, filed Oct. 1, 2004, Trimberger.
U.S. Appl. No. 10/957,261, filed Oct. 1, 2004, Trimberger.
U.S. Appl. No. 10/085,305, filed Feb. 28, 2002, Trimberger.
U.S. Appl. No. 10/104,324, filed Mar. 22, 2002, Wells et al.
U.S. Appl. No. 10/714,380, filed Oct. 31, 2003, Trimberger.
U.S. Appl. No. 10/717,040, filed Nov. 18, 2003, Ngai et al.
U.S. Appl. No. 10/813,414, filed Mar. 26, 2004, Stassart et al.
John Emmert et al.; "Dynamic Fault Tolerance in FPGAs via Partial Reconfiguration"; Annual IEEE Symposium on Field-Programmable Custom Computing Machines; Apr. 17, 2000; pp. 165-174.
John M. Emmert et al.; "Incremental Routing in FPGAs"; ASIC Conference 1998. Proceedings, Eleventh Annual IEEE International; Rochester, NY; Sep. 13-16, 1998; pp. 217-221.
Xilinx, Inc.; "Virtex-II Pro Platform FPGA Handbook"; published Dec. 6, 2000; available from Xilinx, Inc., 2100 Logic Drive, San Jose, California 95124; pp. 33-75.
W. Bruce Culberston et al.; "Defect Tolerance on the Teramac Custom Computer"; The 5th Annual IEEE Symposium on Field-Programmabel Custom Computing Machines; Apr. 16-18, 1997; pp. 116-123.
Fran Hanchek et al.; "Node-Covering Based Defect and Fault Tolerance Methods for Increased Yield in FPGAs"; The Proceedings of the Ninth International Conference on VLSI Design; Jan. 1996; pp. 1-4.
Altera; Altera Data Sheet, vol. I, Chapter 3 "Configuration and Testing"; and vol. 2 Chapter 8 "Remote System Upgrades with Stratix II Devices"; Feb. 2004; downloaded on Jun. 17, 2004 freom http://www.altera.com/literature/lit-stx2.

\* cited by examiner

UTILIZING MULTIPLE BITSTREAMS TO AVOID LOCALIZED DEFECTS IN PARTIALLY DEFECTIVE PROGRAMMABLE INTEGRATED CIRCUITS

FIELD OF THE INVENTION

The invention relates to programmable integrated circuits (ICs). More particularly, the invention relates to methods and structures utilizing multiple configuration bitstreams to program ICs, thereby enabling the utilization of partially defective ICs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data (a configuration bitstream) into internal configuration memory cells that define how the programmable elements are configured. The configuration data can be read from memory (e.g., from an external PROM) or written into the FPGA by an external device. The collective states of the individual memory cells then determine the function of the FPGA.

FPGAs are called "field programmable" because the configuration data is written to the device each time the device is powered up (i.e., the device is programmed in the field). Other field programmable PLDs include Complex Programmable Logic Devices (CPLDs), for example, to which configuration data can be written once and the device remains configured until the configuration data is erased or overwritten. Thus, a CPLD can be programmed by the CPLD provider, the customer, or both. Other field programmable PLDs can include, but are not limited to, anti-fuse and fuse devices. Some PLDs are only partially programmable. For example, one type of PLD includes a combination of hard-coded transistor logic and a programmable switch fabric that programmably interconnects the hard-coded transistor logic.

Figure 1:
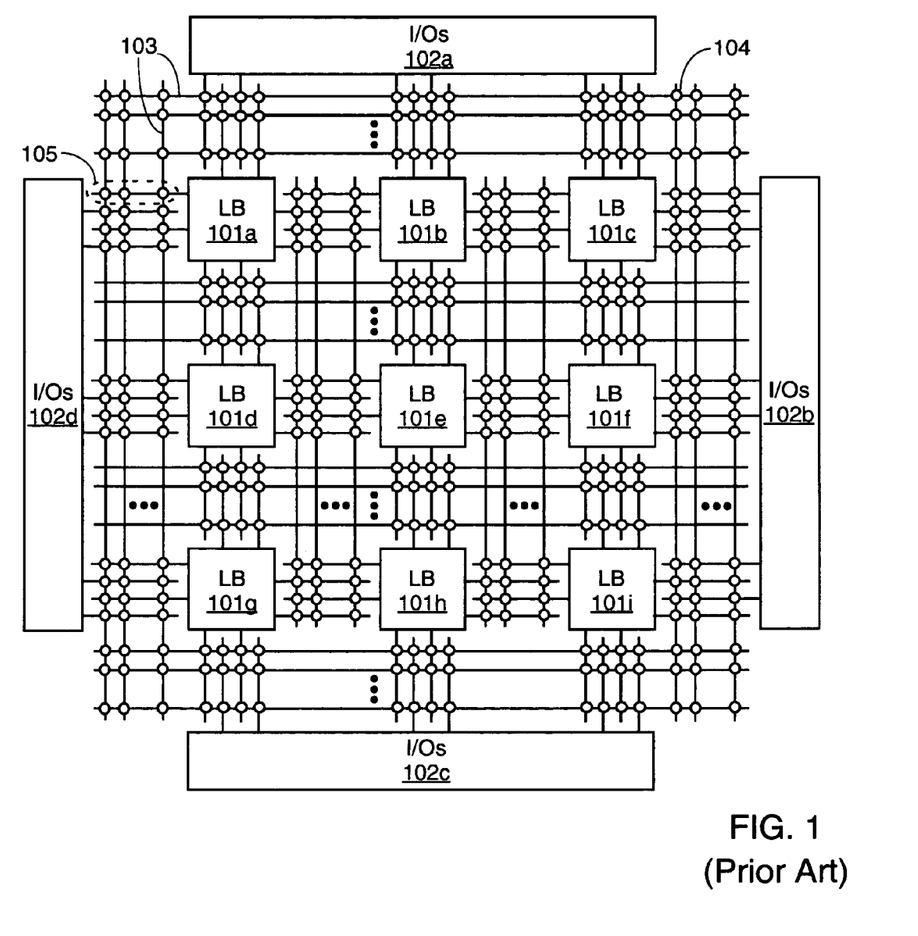
FIG. 1 is a simplified diagram of a well known Field Programmable Gate Array (FPGA) architecture.

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. As noted above, some FPGAs also include additional logic blocks with special purposes (not shown), e.g., DLLs, block RAM, and so forth.

As with any other integrated circuit, a field programmable PLD can include manufacturing defects. A defect too small to see can render a PLD completely or partially nonfunctional. PLD technology trends include rapidly increasing logic density. Thus, PLDs are manufactured using a very small feature size, and a tiny defect is more and more likely to impinge on active logic on the silicon surface of a die. Another important trend is a rapid increase in die size. As PLDs increase in size, the likelihood of a given die including a defect increases dramatically.

If a PLD die contains a single defective resource (e.g., if one of the configuration memory cells in an FPGA is defective), the PLD can render a user's end product unusable, because the user design might need to use that defective resource. To avoid causing problems for end users, a PLD provider generally discards a PLD if it contains even one defect that affects the active logic. Thus, a natural consequence of the increases in PLD size and density is an increase in the percentage of defective die, or a decrease in product yield.

The problem of low yield has significant economic impact on PLD providers. There are two types of defects: gross defects (which cause the failure of an entire PLD) and localized defects (which cause the failure of small portions of the PLD circuitry). It is common to discard large numbers of PLD dice that include only localized defects. Therefore, it is desirable to provide methods for using PLDs having localized defects ("partially defective PLDs") to implement user designs.

One known method for using partially defective PLDs is to sort out those PLDs that are defective only in an isolated function. For example, an FPGA provider can set aside all of those FPGAs in which only the block RAM is defective. If a user design does not use the block RAM, the design will still function correctly when implemented in one of these FPGAs. The FPGA provider can sell these partially defective devices to the customer at a reduced price, as an alternative to discarding them.

However, in FPGAs, for example, many defects occur in the large CLB arrays that can occupy the majority of the die. The CLBs are largely identical to each other, and each CLB can be programmed to perform any of a very large number of functions. Therefore, it is very difficult if not impossible to look at a user design and say with confidence that the implementation software will not use a given CLB to implement the design.

Further, when the design is implemented, the location of the defective CLBs is generally unknown, and is different for each partially defective PLD. Hence, when a single user design is targeted to a large number of partially defective PLDs (e.g., when a user wants to use partially defective PLDs in production to reduce the selling price of the end product), it can be difficult to ensure that the implemented design will not impinge on defective locations in any of the partially defective PLDs.

Therefore, it is desirable to provide additional methods enabling the utilization of partially defective PLDs.

SUMMARY OF THE INVENTION

The invention provides methods and structures utilizing multiple configuration bitstreams to program integrated circuits (ICs) such as programmable logic devices (PLDs), thereby enabling the utilization of partially defective ICs. A user design is implemented two or more times, preferably utilizing different programmable resources as much as possible in each configuration bitstream. The resulting configuration bitstreams are stored in a memory device such as a programmable read-only memory (PROM). Under the control of a configuration control circuit or device, the various bitstreams are sequentially loaded into a partially defective IC and tested using an automated testing procedure. When a bitstream is found that enables the design to function correctly in the programmed IC, i.e., that avoids the defective programmable resources in the IC, the configuration procedure terminates. The programmed IC begins to function according to the user design as determined by the last programmed bitstream. If none of the configuration bitstreams succeed in avoiding the defective programmable resources in the IC, the IC can be rejected as unsuitable for implementing that particular design. The methods and structures of the invention can enable the use of ICs including manufacturing defects, programming failures or defects, or defects that occur in the field, or any combination of these.

According to another embodiment, a system includes an IC (e.g., a partially defective PLD) and a memory device. In this embodiment, the automated configuration procedure is controlled by a configuration control circuit included in the IC. The IC includes programmable resources, a configuration port coupled to the programmable resources, and a configuration control circuit coupled to the programmable resources and to the configuration port. The memory device is coupled to the configuration port of the IC, and includes at least two configuration bitstreams. Each configuration bitstream implements a functionally equivalent design in the IC, and each configuration bitstream utilizes a different set of the programmable resources. This system can be used, for example, to implement the methods described above.

According to yet another embodiment, a system includes an IC (e.g., a partially defective PLD), a memory device, and a configuration control device. In this embodiment, the automated configuration procedure is controlled by a circuit external to the IC, i.e., the configuration control device. The IC includes programmable resources, a configuration port coupled to the programmable resources, and a test port coupled to the programmable resources. The memory device is coupled to the configuration port of the IC, and includes at least two configuration bitstreams. Each configuration bitstream implements a functionally equivalent design in the IC, and each configuration bitstream utilizes a different set of the programmable resources. The configuration control device is coupled to the configuration port of the IC and is further coupled to the memory device. This system can also be used, for example, to implement the methods described above.

In some embodiments, one or more test configuration bitstreams are also included in the memory device. Each test configuration bitstream is associated with at least one of the user configuration bitstreams, and is designed to facilitate testing those of the programmable resources in the IC that are utilized by the associated user configuration bitstream. The test configuration bitstreams are sequentially programmed into the IC and tested using an automated testing procedure. When one of the test configuration bitstreams is found that passes the tests, the associated user bitstream is programmed into the IC and the IC begins normal operations as defined by the user design. In some embodiments, a single test configuration bitstream is tested (e.g., a single test bitstream that includes all of the programmable resources used by any of the user bitstreams), and the results of this single test are used to select one of the user bitstreams to implement the user design.

According to another embodiment, a system includes an IC (e.g., a partially defective PLD) and a memory device. In this embodiment, the automated configuration procedure is controlled by a configuration control circuit included in the IC. The IC includes programmable resources, a configuration port coupled to the programmable resources, and a configuration control circuit coupled to the programmable resources and to the configuration port. The memory device is coupled to the configuration port of the IC, and includes one or more test configuration bitstreams as well as at least two associated user configuration bitstreams. Each user configuration bitstream implements a functionally equivalent design in the IC, each user configuration bitstream utilizes a different set of the programmable resources, and each test configuration bitstream is configured and arranged to facilitate testing those of the programmable resources utilized by at least one associated user configuration bitstream. This system can be used, for example, to implement the methods described above.

According to yet another embodiment, a system includes an IC (e.g., a partially defective PLD), a memory device, and a configuration control device. In this embodiment, the automated configuration procedure is controlled by a circuit external to the IC, i.e., the configuration control device. The IC includes programmable resources, a configuration port coupled to the programmable resources, and a test port coupled to the programmable resources. The memory device is coupled to the configuration port of the IC, and includes one or more test configuration bitstreams as well as at least two user configuration bitstreams. Each user configuration bitstream implements a functionally equivalent design in the IC, each configuration bitstream utilizes a different set of the programmable resources, and each test configuration bitstream is configured and arranged to facilitate testing those of the programmable resources utilized by at least one associated user configuration bitstream. The configuration control device is coupled to the configuration port of the IC and is further coupled to the memory device. This system can also be used, for example, to implement the methods described above.

According to another embodiment, the invention provides a memory device including data structures that can be used, for example, to implement the methods described above. For example, the memory device (e.g., a PROM or a computer-readable medium such as a disk drive, a floppy disk, and so forth) includes at least two user configuration bitstreams. Each user configuration bitstream implements a functionally equivalent design in the IC, and each user configuration bitstream utilizes a different set of the programmable resources. Some embodiments further include test values associated with the user configuration bitstreams and/or instructions pertaining to testing the user configuration bitstreams. In some embodiments, the memory device also includes one or more test configuration bitstreams, and can also include test values associated with the test configuration bitstreams and/or instructions pertaining to testing the test configuration bitstreams.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples, and can be applied to virtually any IC that includes programmable resources.

Figure 2:
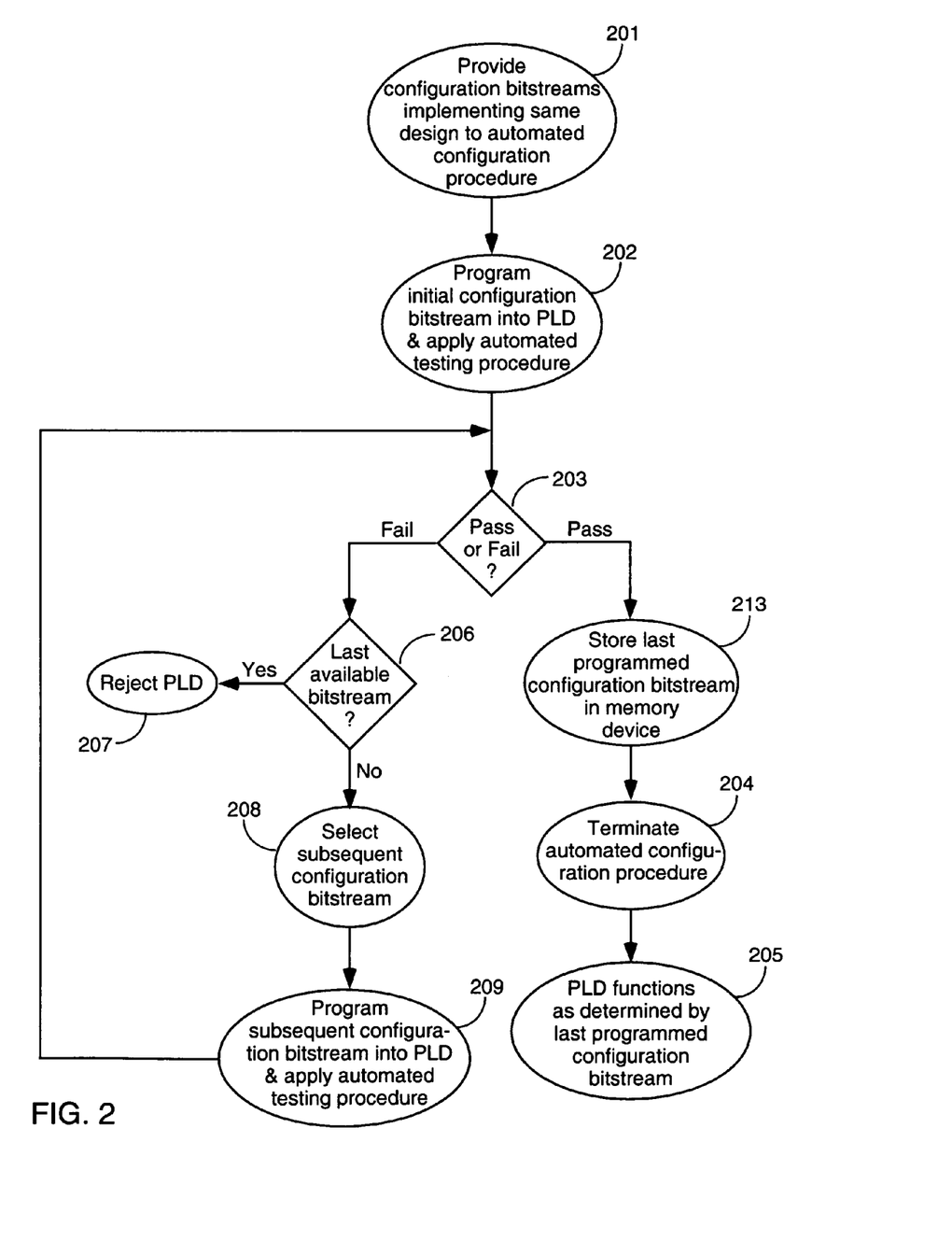
FIG. 2 illustrates the steps of a first method of programming a programmable logic device (PLD) that utilizes a plurality of configuration bitstreams implementing the same design.

FIG. 2 illustrates the steps of a first exemplary method of programming a PLD (e.g., a partially defective PLD) by selecting one of two or more available configuration bitstreams implementing the same design. The PLD can be an FPGA or some other type of PLD. Note that the phrase "implementing the same design" as used herein means "providing equivalent functionality", and not necessarily having exactly the same implementation in each case. For example, as is well known, active-high signals can be replaced with active-low signals by making straightforward alterations to the circuitry, and logical circuits can be replaced by their logical equivalents by appropriately inverting input and output signals. These and other logical differences can exist between designs without affecting the functional equivalence of the various implementations. However, in some embodiments, the bitstreams implement designs that are logically, as well as functionally, equivalent. Designs that are logically and/or functionally equivalent can use different sets of programmable resources. For example, an AND gate in the design can be realized in different logic blocks in different implementations. As another example, the routing paths between logic blocks can take different paths in different implementations. Further, timing differences can exist between the various design implementations. However, if each bitstream causes a fully functional PLD to function properly in a system, the bitstreams are considered functionally equivalent.

In step 201 of FIG. 2, two or more configuration bitstreams are provided that implement the same design in a PLD. For example, the configuration bitstreams can be loaded into a memory device such as a programmable read only memory (PROM) or a computer readable medium (e.g., a disk drive, a floppy disk, and so forth). The memory device can then be coupled to a configuration port of the PLD. In some embodiments, test instructions and/or data values are also provided. When provided, each test data value is associated with one or more configuration bitstreams. The test data values can include, for example, data expected from an automated testing procedure when applied to a fully functional PLD programmed with an associated configuration bitstream. In some embodiments, the test data values are checksum values. In some embodiments, test instructions and/or data values are not included in the memory device.

Each of the configuration bitstreams utilizes a different set of programmable resources in the PLD. The sets of programmable resources utilized by each configuration bitstream can be overlapping, i.e., at least one of the programmable resources in the PLD can be included in at least two of the sets. Alternatively, the sets of programmable resources can be non-overlapping. In some embodiments, each of the configuration bitstreams enables the design to meet a common set of predetermined timing constraints when programmed into a fully functional PLD.

In some embodiments, each of the programmable resources in the PLD is excluded from at least one of the sets. In these embodiments, a single defect (e.g., a manufacturing defect) that disables any of the programmable resources can be avoided by selecting a bitstream that does not utilize the resource. Sometimes it is not possible or not practical (e.g., due to limitations on the number of bitstreams) to exclude every resource from at least one bitstream. However, it is clearly desirable to keep the number of duplicated programmable resources relatively small. In some embodiments, no more than two percent (or an even smaller percentage) of the programmable resources are commonly utilized by all of the configuration bitstreams. In embodiments where each of the bitstreams includes at least one common set of the programmable resources, the logic that utilizes the common set can optionally be implemented using triple modular redundancy (TMR). Thus, a single defect affecting the common set can be overcome by the TMR implementation. These embodiments can be used, for example, to reduce the number of bitstreams that must be provided to provide a given likelihood of successful configuration for a particular design.

The number of configuration bitstreams needed to achieve a certain level of results can also be reduced by using different programmable resources as much as possible for each configuration bitstream. For example, a placement or routing penalty can be applied to each feature that has already been used in one or more previously-generated bitstreams. The use of penalty constraints is well known in the art of PLD implementation software.

In step 202, an initial configuration bitstream is selected from the provided bitstreams and programmed into the PLD, and an automated testing procedure is applied to the programmed PLD. The automated testing procedure can be controlled, for example, by a configuration control circuit that forms a portion of the PLD. In other embodiments, the automated testing procedure is controlled by a configuration control device external to the PLD.

Test patterns exercised by the automated testing procedure can be restricted to driving and sensing at the pins, or can permit access to internal registers to simplify the tests. The configuration control circuit or device can use JTAG INTEST commands, for example, to perform the tests. In some embodiments, the automated testing procedure includes loading additional configuration data (e.g., from the same memory device or from another source) and performing one or more partial reconfigurations. For example, the automated testing procedure can load a series of BIST (built in self test) circuits into the PLD, then run self-test sequences using the BIST circuits. Test patterns exercised by the automated testing procedure can also include IDDQ tests, which are well-known, and/or tests on the performance of the design, wherein a test fails if the PLD does not produce results quickly enough.

Instructions for the automated testing procedure can include, for example, instructions such as "set test value", "start test clock", "step test clock", "capture results", "read back results and compare", "read back results to CRC", "compare results, setting status register", "if status OK then read next configuration and start", "scan for next sync word", "stop and fail", and "if status BAD then skip N words". For this last instruction, the next instruction after N words can be "stop and fail" if this is the last bitstream, or can direct the resumption of testing with the next test design. An addition to providing other functionality, these instructions can permit a PLD to select a given configuration bitstream without signaling to the memory device or to an external controller. Therefore, the memory device can be a simple serial memory. Additionally, these instructions permit a PLD included in a configuration daisy chain to use the bitstream selection methods described herein.

Instructions for the automated testing procedure can be provided in many different ways. For example, instructions can be built into (or programmed into) the configuration control circuit or device. In some embodiments, instructions controlling the automated testing procedure are included in the memory device storing the configuration bitstreams. In other embodiments, the instructions are provided by another source. In some embodiments, instructions for automated testing are implemented as sequences of simpler instructions in a microprocessor.

In evaluation step 203, it is determined whether or not the configuration bitstream/PLD combination has passed the automated testing procedure. If the bitstream/PLD combination is successful, then the bitstream currently loaded in the PLD successfully bypasses any defects that might be present in the PLD. In optional step 213, the last programmed bitstream, which has been shown to be suitable for the PLD, is stored in a memory device (e.g., a PROM). In other embodiments, a bitstream other than the last-programmed bitstream is selected for storage in the memory device, based on the results of one or more automated test procedures. Unused bitstreams, test bitstreams, and test data, if any, are not written to the memory device. Future configurations of the PLD can optionally by performed using standard methods to load the selected bitstream from the memory device, eliminating the need for repeatedly performing the automated configuration procedure illustrated in FIG. 2.

In step 204, the automated configuration procedure is terminated, allowing the programmed PLD to assume a predetermined function as determined by the previously programmed configuration bitstream (step 205). Steps 204 and 205 can be omitted if step 213 is performed.

If the bitstream/PLD combination just tested is not successful, then the bitstream currently loaded in the PLD is unsuitable for that PLD. In decision step 206, it is determined whether or not additional bitstreams are available that have not yet been tried in this PLD. If the bitstream that failed the test was the last available bitstream, the PLD is rejected (step 207). For example, a flag can be set in the memory device or elsewhere in the system indicating a failed PLD. If at least one more bitstream remains available and untested, a subsequent configuration bitstream is selected (step 208) and programmed into the PLD, and the automated testing procedure is applied to the newly programmed PLD (step 209). The process then resumes at decision step 203.

Note that the subsequent configuration bitstream need not be sequentially situated in the memory device, but can be located anywhere in the memory device. In some embodiments, the configuration control circuit or device selects from among two or more remaining configuration bitstreams based on the results of the automated testing procedure. The selection can be made based only on the results of the most recent automated testing procedure, or on accumulated results from two or more automated testing procedures. In other embodiments, the subsequent configuration bitstream is always or defaults to the configuration bitstream stored at the next address in the memory device.

In some embodiments, all of the configuration bitstreams are complete bitstreams (reconfiguring the entire PLD). In other embodiments, at least one of the configuration bitstreams is a partial configuration bitstream. In some embodiments (e.g., where the configuration control circuit is programmed into the PLD), the initial configuration bitstream includes the configuration control circuit or is a partial configuration bitstream that does not overwrite the configuration control circuit.

In some embodiments a compatible bitstream, once identified, is relocated within the testing sequence to be tested at an earlier stage of the process, thereby reducing configuration time for the PLD. (This relocation can occur, for example, as part of step 213 in FIG. 2.) This relocation can involve reprogramming the memory device, altering test instructions located in the memory device or elsewhere, or by other means.

In some embodiments, the system is designed to include a check mode and a standard mode. A PLD can be initially programmed in check mode, in which the method shown in FIG. 2 is implemented. After successfully identifying a compatible bitstream, the identified bitstream is flagged (e.g., by placing the location of the bitstream in the memory device into a predefined register) and the system is placed into the standard mode. In the standard mode, the PLD is automatically programmed using the flagged compatible bitstream, bypassing the automated configuration procedure shown in FIG. 2. In some embodiments, the mode selection is included in one or more of the configuration bitstreams. In other embodiments, check mode is entered via a JTAG command. In some embodiments, the identified compatible bitstream is loaded into a PROM or other memory device as part of the automated configuration procedure.

In some embodiments, the last available configuration bitstream is not tested. If none of the other bitstreams has proved compatible, the last remaining bitstream is the only option remaining. Therefore, the last remaining bitstream is used to configure the PLD, by default. In some embodiments, the bitstream that produces the smallest number of faults during testing is used to configure the PLD.

Figure 3:
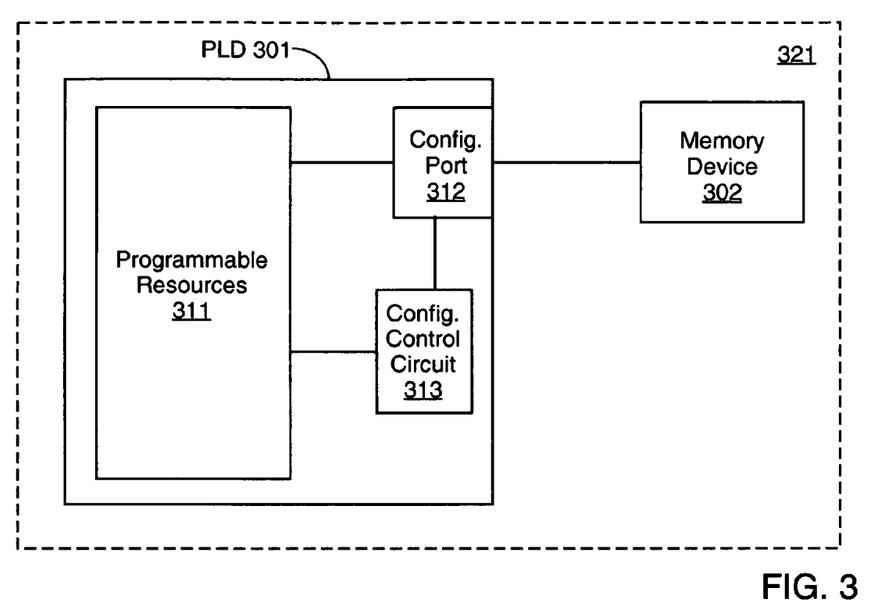
FIG. 3 illustrates a first system that can be used, for example, to implement the method of FIG. 2.

FIG. 3 illustrates a first exemplary system that can be used, for example, to implement the method of FIG. 2. The system of FIG. 3 includes a PLD 301 and a memory device 302. PLD 301 can be, for example, an FPGA. PLD 301 can be a partially defective PLD or a fully functional PLD. PLD 301 includes programmable resources 311 (e.g., programmable logic blocks and programmable interconnect), a configuration port 312 coupled to programmable resources 311, and a configuration control circuit 313 coupled to programmable resources 311 and to configuration port 312. Configuration control circuit 313 can be, for example, an on-chip hard processor or soft processor (e.g., programmed into the programmable resources 311), or dedicated logic. Configuration port 312 of PLD 301 is coupled to memory device 302. In some embodiments, the system includes an integrated circuit (IC) package 321 that encloses PLD 301 and memory device 302.

Memory device 302 can be, for example, a PROM or a computer-readable medium such as a disk drive, a floppy disk, and so forth. Memory device 302 can also include two or more memory devices coupled together, or individually coupled to one or more configuration ports of the PLD (e.g., configuration port 312). For example, each configuration bitstream could be stored in a corresponding PROM. Memory device 302 includes at least two configuration bitstreams implementing function equivalent designs, as described above in connection with FIG. 2. Each of the configuration bitstreams utilizes a different set of the programmable resources, also as described above. All of the configuration bitstreams can be complete bitstreams (reconfiguring the entire PLD) or some can be partial configuration bitstreams. In some embodiments (e.g., where configuration control circuit 313 is programmed into PLD 301), the initial configuration bitstream is a partial configuration bitstream that does not overwrite the configuration control circuit.

Each of the configuration bitstreams utilizes a different set of programmable resources in the PLD. The sets of programmable resources utilized by each design can be overlapping, i.e., at least one of the programmable resources in the PLD can be included in at least two of the sets. Alternatively, the sets of programmable resources can be non-overlapping. In some embodiments, each of the configuration bitstreams enables the design to meet a common set of predetermined timing constraints when programmed into a fully functional PLD.

In some embodiments, each of the programmable resources in the PLD is excluded from at least one of the sets. In some embodiments, no more than two percent of the programmable resources are included in all of the sets. In some embodiments, each of the bitstreams includes at least one common set of the programmable resources, and the logic that utilizes the common set is implemented using triple modular redundancy (TMR).

Memory device 302 can also include test instructions and/or data values readable by configuration control circuit 313. Each test data value is associated with at least one of the configuration bitstreams. The test data values can include, for example, data expected from an automated testing procedure when applied to a fully functional PLD programmed with an associated configuration bitstream. In some embodiments, the test data values are checksum values.

Figure 4:
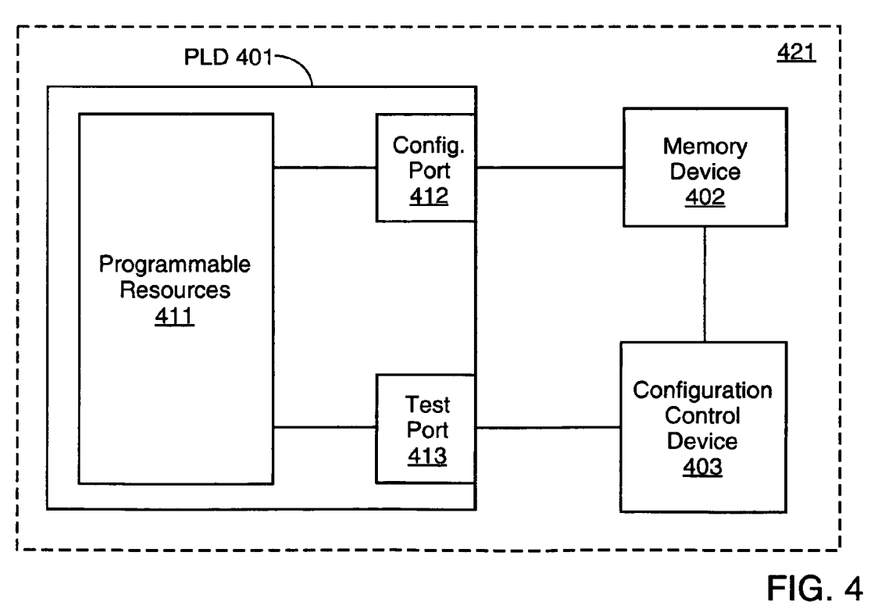
FIG. 4 illustrates a second system that can be used, for example, to implement the method of FIG. 2.

FIG. 4 illustrates a second exemplary system that can be used, for example, to implement the method of FIG. 2. The system of FIG. 4 includes a PLD 401, a memory device 402, and a configuration control device 403. PLD 401 can be, for example, an FPGA. PLD 401 can be a partially defective PLD or a fully functional PLD. PLD 401 includes programmable resources 411 (e.g., programmable logic blocks and programmable interconnect), a configuration port 412 coupled to programmable resources 411, and a test port 413 coupled to programmable resources 411. Configuration port 412 of PLD 401 is coupled to memory device 402. Test port 403 of PLD 401 is coupled to configuration control device 403. Configuration control device 403 is also coupled to memory device 402. In some embodiments, the system includes an integrated circuit (IC) package 421 that encloses PLD 401, memory device 402, and configuration control device 403.

Configuration control device 403 can be, for example, another PLD, a processor, or another device capable of controlling the configuration procedure shown in FIG. 2. Memory device 402 can be, for example, similar to memory device 302 of FIG. 3.

Figure 5:
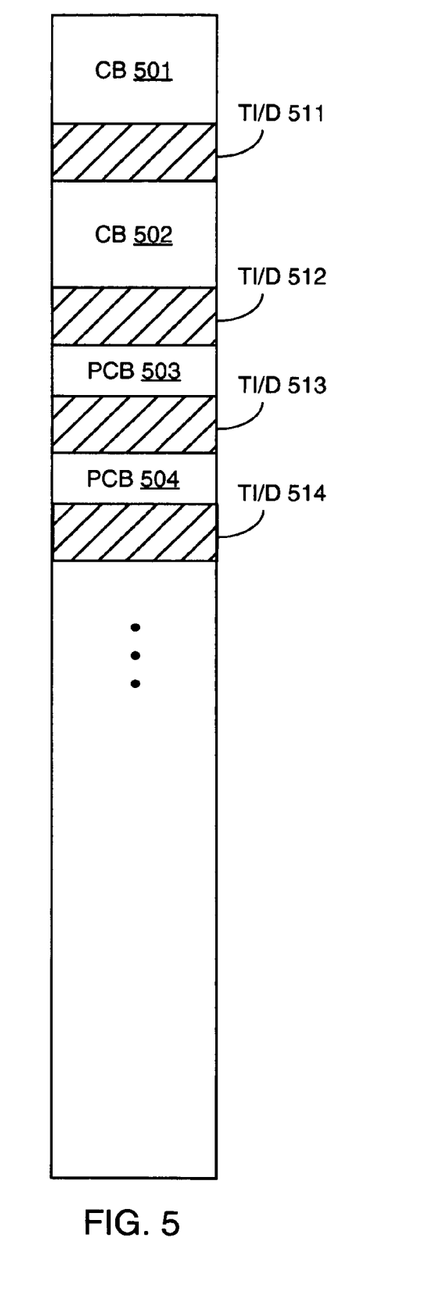
FIG. 5 illustrates a data structure/memory device that can be used, for example, to implement the method of FIG. 2.

FIG. 5 illustrates a data structure/memory device that can be used, for example, to implement the method of FIG. 2. The data structure/memory device of FIG. 5 includes configuration bitstreams (CBs) 501, 502, 503, 504 . . . and test instructions and/or data (TI/D) 511, 512, 513, 514 . . . . The test instructions can be, for example, instructions readable by the configuration control circuit or device and pertaining to testing the associated configuration bitstreams. For example, each set of test instructions can designate a subsequent configuration bitstream to be loaded into the PLD and tested using the automated testing procedure in case of failure of the PLD configured with the associated configuration bitstream. Test data can include test data values associated with the test configuration bitstreams, such as values expected from the automated testing procedure when applied to a fully functional PLD programmed with the associated configuration bitstream(s), and/or checksum values.

Each of the configuration bitstreams 501, 502, 503, 504 . . . implements a functionally equivalent design and utilizes a different set of programmable resources in the target PLD. Note that in the pictured embodiment configuration bitstreams 503 and 504 are partial configuration bitstreams (PCBs). Thus, configuration bitstreams 503 and 504 each implement a functionally equivalent design when loaded in the proper sequence after a complete configuration bitstream such as one of bitstreams 501 and 502.

Figure 6:
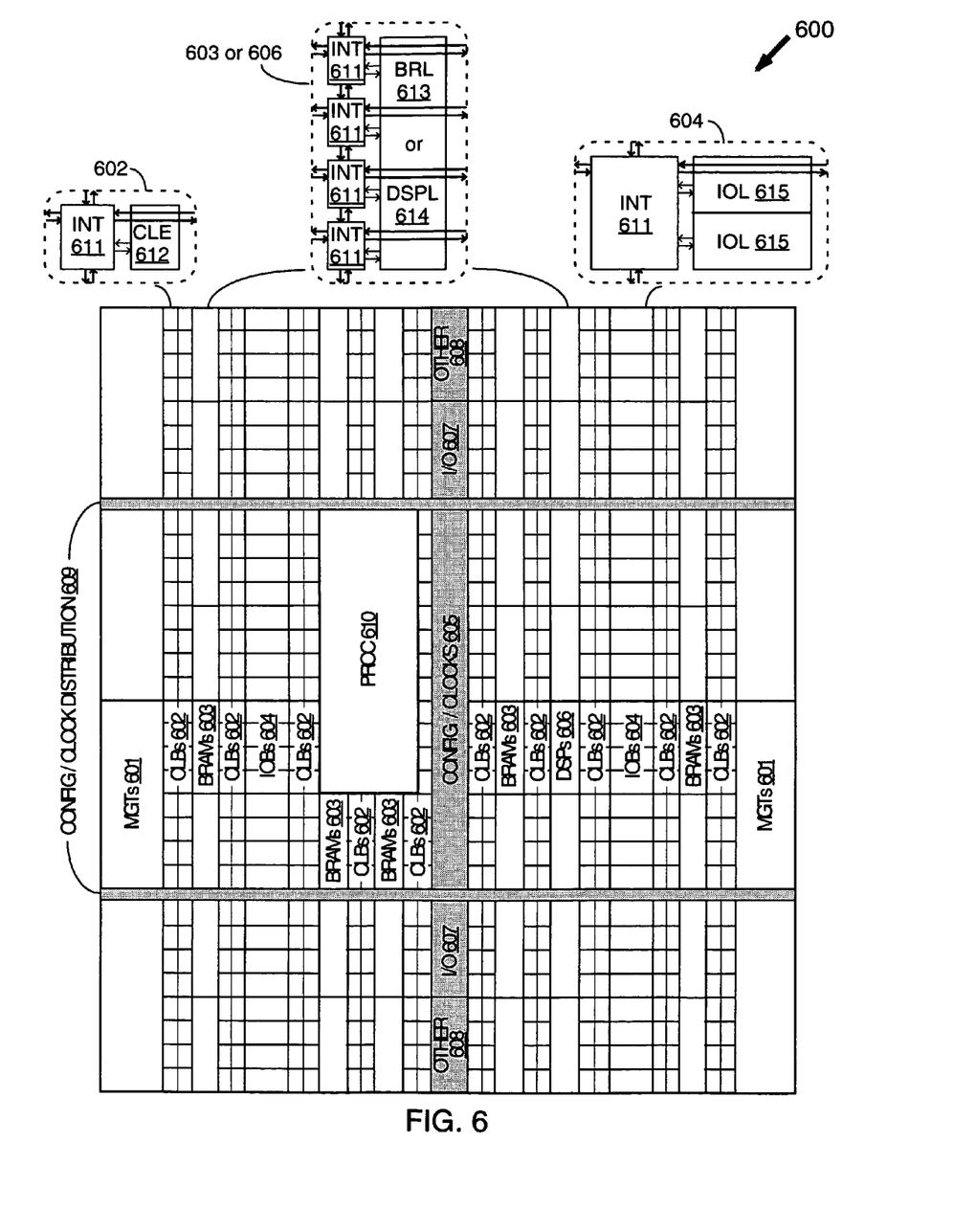
FIG. 6 is a block diagram of an exemplary FPGA that can be programmed, for example, using the method of FIG. 2.

FIG. 6 is a block diagram of an exemplary FPGA 600 that can be programmed, for example, using the method of FIG. 2. This FPGA is well-suited to an automated testing procedure, because of the repetitive nature of the interconnect resources. The FPGA architecture of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

In some embodiments, a portion of the programmable logic (e.g., including CLBs, IOBs, BRAMs, PROC, interconnect, and/or other user-programmable logic) of FIG. 6 is pre-tested and is then used to implement configuration control circuit 313 of FIG. 3. In these embodiments, no additional circuitry is required on the PLD or in an external configuration control device to implement the invention. However, the PLD includes the ability to reprogram itself as it continues to operate. The ability to self-reprogram is a feature now available in advanced FPGAs such as the Virtex™-II series FPGAs from Xilinx, Inc. Because the programmable logic used by the configuration control circuit must function correctly if this method is to be practiced by the PLD end-user, fewer total defects can be avoided. However, there is no need to test the programmable logic used for the configuration control circuit during execution of the inventive methods, because this logic is already known to be correct.

Note that FIG. 6 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 7:
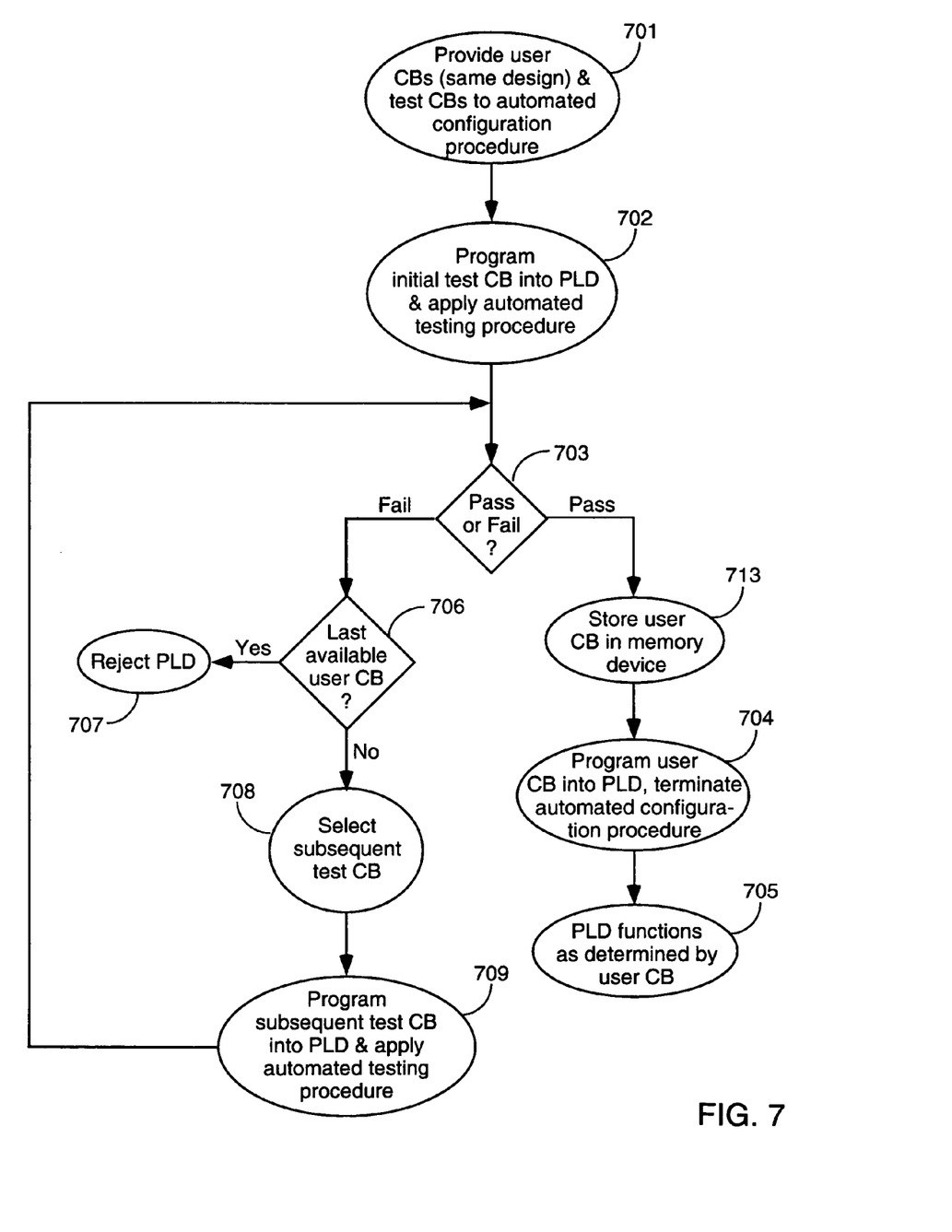
FIG. 7 illustrates the steps of a second method of programming a PLD that utilizes a plurality of configuration bitstreams implementing the same design.

FIG. 7 illustrates the steps of a second method of programming a PLD that utilizes a plurality of configuration bitstreams implementing the same design. The systems of FIGS. 3 and 4, described above in relation to the method of FIG. 2, can also optionally be used to implement the method of FIG. 7 by including in the memory device the necessary data as described below. The exemplary FPGA of FIG. 6 can optionally be used to implement the method of FIG. 7.

A difference between the methods of FIGS. 2 and 7 is that in FIG. 7, rather than testing the actual user bitstreams that will be used to operate the PLD in the system, separate test bitstreams are provided that are used by the automated testing procedure to test the PLD. Based on the results of testing the test bitstreams, one of the user bitstreams is selected and is used to configure the PLD for use in the system. Test bitstreams can be generated, for example, using well-known ASIC ATPG algorithms.

In step 701 of FIG. 7, two or more user configuration bitstreams (CBs) are provided that implement the same design in a PLD. Also provided are two or more test configuration bitstreams, each being associated with at least one of the user configuration bitstreams. Each test configuration bitstream is designed to facilitate testing the programmable resources in the PLD that are utilized by the associated user configuration bitstream. In some embodiments, each test configuration bitstream is designed to facilitate testing all of the programmable resources used by the associated user configuration bitstream. In other embodiments, each test configuration bitstream is designed to facilitate testing only those programmable resources used by the associated user configuration bitstream that are not fully tested as part of the manufacturing process. In some embodiments, the test bitstreams are designed to only detect defects in the interconnect resources of the PLD, which simplifies the testing procedure. In some embodiments, the test bitstreams are designed to facilitate testing of other subsets of the programmable resources in the PLD that are utilized by the associated user configuration bitstream. For example, the test bitstreams can be designed to facilitate testing of those programmable resources most susceptible to fabrication defects.

In some embodiments, the correspondence between user bitstreams and test configuration bitstreams is not one-to-one. In other words, one of the test bitstreams can be associated with (e.g., can be used to test) two or more of the user bitstreams. This can save space when two or more of the user bitstreams utilize partially overlapping sets of programmable resources in the PLD. Additionally or alternatively, one of the user bitstreams can be associated with two or more of the test bitstreams. By dividing the necessary testing for each user bitstream into smaller tests, the test bitstreams can potentially be shared more effectively between user bitstreams.

The user configuration bitstreams and test configuration bitstreams can be loaded into a memory device such as a programmable read only memory (PROM) or a computer readable medium (e.g., a disk drive, a floppy disk, and so forth). The memory device can then be coupled to a configuration port of the PLD. In some embodiments, test instructions and/or data values are also provided. When provided, each test data value is associated with one or more test configuration bitstreams. The test data values can include, for example, data expected from an automated testing procedure when applied to a fully functional PLD programmed with an associated test configuration bitstream. In some embodiments, the test data values are checksum values. In some embodiments test data values are not required, because the test configuration bitstream includes all verification logic needed to signal the results of the test to the configuration control circuit or device. In some embodiments, test instructions are not included in the memory device.

Each of the user configuration bitstreams utilizes a different set of programmable resources in the PLD. The sets of programmable resources utilized by each user configuration bitstream can be overlapping, i.e., at least one of the programmable resources in the PLD can be included in at least two of the sets. Alternatively, the sets of programmable resources can be non-overlapping. In some embodiments, each of the user configuration bitstreams enables the design to meet a common set of predetermined timing constraints when programmed into a fully functional PLD.

In some embodiments, each of the programmable resources in the PLD is excluded from at least one of the sets. In some embodiments, no more than two percent of the programmable resources are included in all of the sets. In embodiments where each of the user bitstreams includes at least one common set of the programmable resources, the logic that utilizes the common set can optionally be implemented using triple modular redundancy (TMR).

In step 702, an initial test configuration bitstream is selected from the provided test bitstreams and programmed into the PLD, and an automated testing procedure is applied to the programmed PLD. The PLD can be a partially defective PLD or a fully functional PLD. The automated testing procedure can be controlled, for example, by a configuration control circuit that forms a portion of the PLD (e.g., either programmed into the programmable logic or coded as transistor logic on the PLD die). In other embodiments, the automated testing procedure is controlled by a configuration control device external to the PLD.

Test patterns exercised by the automated testing procedure can be similar, for example, to those described in connection with FIG. 2. Test instructions can also be similar, for example, to those described in connection with FIG. 2, and can be provided in a similar variety of ways.

An exemplary automated testing procedure is now described, in which the test bitstreams are designed to only detect defects in the interconnect resources of the PLD. Suppose that as part of the manufacturing process, all shorts in the interconnect lines have already been identified and the PLD exhibiting shorts have been discarded. The design implemented by the test bitstream includes every net utilized by the associated user bitstream. The source of each net is a programmable lookup table (LUT), set in shift register mode. Signal sources generated by flip-flops in the user design are modified in the test design to come from the LUT (e.g., by programming the flip-flop as a latch in transparent latch mode). The destination of every signal is routed to a flip-flop. All signals are initially sourced by the first value from the flip-flop. The results are captured in the destination flip-flops and read from the PLD using well-known techniques such as configuration readback. To input a new signal, the LUTs are clocked at the source, and the results are checked again, e.g., using configuration readback. Timing on nets can be verified by setting the interval between the source LUT clock signal and the destination flip-flop capture clock signal. This interval can be embedded in the test design.

In the automated test procedure just described, all PLDs including shorts in the interconnect lines have already been discarded. Alternatively, the bit patterns in the shift register LUTs can be selected such that interconnect lines that might be shorted together will have different values at some time in the test sequence.

In evaluation step 703, it is determined whether or not the test bitstream/PLD combination has passed the automated testing procedure. If the test bitstream/PLD combination is successful, then the test bitstream currently loaded in the PLD successfully bypasses any defects that might be present in the PLD. Because the test bitstream is designed to test the programmable resources used by the associated user bitstream, the associated user bitstream is also likely to bypass any defects that might be present in the PLD (the likelihood depending on the coverage provided by the test configuration bitstream). In this instance, in optional step 713, the associated user bitstream is stored in a memory device (e.g., a PROM). Unused bitstreams, test bitstreams, and test data, if any, are not written to the memory device. Future configurations of the PLD can optionally by performed using standard methods to load the stored user bitstream from the memory device, eliminating the need for repeatedly performing the automated configuration procedure illustrated in FIG. 7.

In step 704, the associated user bitstream is programmed into the PLD and the automated configuration procedure illustrated in FIG. 7 is terminated (step 704), allowing the programmed PLD to assume a predetermined function as determined by the user configuration bitstream (step 705). Steps 704 and 705 can be omitted if step 713 is performed.

If the test bitstream/PLD combination just tested is not successful, then the associated user bitstream is unsuitable for that PLD. In decision step 706, it is determined whether or not additional user bitstreams are available for which the associated test bitstream(s) have not yet been tried in this PLD. If not, the PLD is rejected (step 707). For example, a flag can be set in the memory device or elsewhere in the system indicating a failed PLD. If at least one more user bitstream remains available and the associated test bitstream(s) have not yet been tested in this PLD, a subsequent test configuration bitstream is selected (step 708) and programmed into the PLD, and the automated testing procedure is applied to the newly programmed PLD (step 709). The process then resumes at decision step 703.

Note that the subsequent test configuration bitstream need not be sequentially situated in the memory device, but can be located anywhere in the memory device. In some embodiments, the configuration control circuit or device selects from among two or more remaining test configuration bitstreams based on the results of the automated testing procedure. The selection can be made based only on the results of the most recent automated testing procedure, or on accumulated results from two or more automated testing procedures. In other embodiments, the subsequent test configuration bitstream is always or defaults to the test configuration bitstream stored at the next address in the memory device.

In some embodiments, all of the test configuration bitstreams and all of the user configuration bitstreams are complete bitstreams (reconfiguring the entire PLD). In other embodiments, at least one of the configuration bitstreams is a partial configuration bitstream. In some embodiments (e.g., where the configuration control circuit is programmed into the PLD), the initial test configuration bitstream includes the configuration control circuit or is a partial configuration bitstream that does not overwrite the configuration control circuit. In some embodiments, at least one of the user bitstreams is a partial bitstream, and some of the configuration data from the associated test bitstream is retained in the programmed PLD.

In some embodiments a compatible user bitstream, once identified, is relocated within the testing sequence to be tested at an earlier stage of the process, in a fashion similar to that described in conjunction with FIG. 2. In some embodiments, the system is designed to include a check mode and a standard mode, in a fashion similar to that described in conjunction with FIG. 2. In some embodiments, the last available user configuration bitstream is not tested, in a fashion similar to that described in conjunction with FIG. 2.

Figure 8:
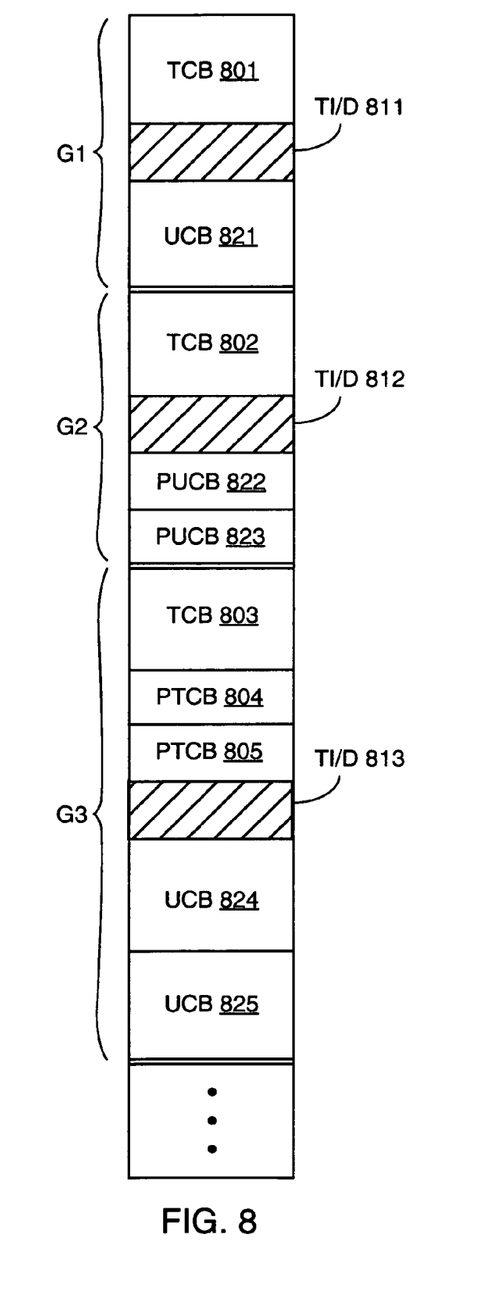
FIG. 8 illustrates a data structure/memory device that can be used, for example, to implement the method of FIG. 7.

FIG. 8 illustrates a data structure/memory device that can be used, for example, to implement the method of FIG. 7. The exemplary data structure/memory device of FIG. 8 includes test configuration bitstreams (TCBs) 801, 802, 803, 804, 805..., test instructions and/or data (TI/D) 811, 812, 813..., and user configuration bitstreams (UCBs) 821, 822, 823, 824, 825....

Each of the user configuration bitstreams implements a functionally equivalent design and utilizes a different set of programmable resources in the target PLD. Note that in the pictured embodiment user configuration bitstreams 822-823 are partial configuration bitstreams (PUCBs). Thus, configuration bitstreams 822-823 each implement a functionally equivalent design when loaded in the proper sequence after a complete configuration bitstream such as test configuration bitstream 802.

The data structure/memory device of FIG. 8 is conceptually and/or physically divided into groups of data G1, G2, G3.... Each group of data includes at least one test configuration bitstream, test instructions and/or data associated with the test configuration bitstream(s), and one or more user configuration bitstreams being tested by the test bitstreams, instructions, and data in the group. Each group can be used to test one or more user configuration bitstreams, as will now be described in conjunction with the exemplary groups shown in FIG. 8.

Group 1 is used to test and (if successful) begin operation of the PLD using a first user configuration bitstream 821. Test configuration bitstream 801 is loaded into the PLD (e.g., a partially defective PLD). An automated testing procedure is performed using test instructions and/or data 811. If the programmed PLD passes the automated testing procedure, user configuration bitstream 821 is loaded into the PLD, and the automated configuration procedure terminates, allowing the programmed PLD to function as determined by user configuration bitstream 821.

If Group 1 does not lead to a successful test, Group 2 is used to test and (if successful) begin operation of the PLD using one of user configuration bitstreams 822 and 823. Test configuration bitstream 802 is loaded into the PLD (e.g., a partially defective PLD). The automated testing procedure is performed using test instructions and/or data 812. If, for example, the automated testing procedure reports that any failures are limited to a first area of the PLD not used by bitstream 822, user configuration bitstream 822 is loaded into the PLD and the automated configuration procedure terminates, allowing the programmed PLD to function as determined by user configuration bitstream 822. However, if the automated testing procedure reports that any failures are limited to a second area of the PLD not used by bitstream 923, user configuration bitstream 823 is loaded into the PLD and the automated configuration procedure terminates, allowing the programmed PLD to function as determined by user configuration bitstream 823.

In the pictured embodiment, bitstreams 822 and 823 are partial user configuration bitstreams (PUCBs). Therefore, for example, some of the configuration data controlling the function of the PLD after termination of the automated configuration procedure was retained from the test bitstream 802. Sharing some of the configuration data from the test bitstream with two different user configurations can save storage space on the memory device and reduce the amount of time required to determine the compatibility of user configuration bitstreams 822 and 823 with the PLD under test.

If Group 2 does not lead to a successful test, Group 3 is used to test and (if successful) begin operation of the PLD using one of user configuration bitstreams 824 and 825. Test configuration bitstream 803 is loaded into the PLD (e.g., a partially defective PLD). The automated testing procedure is performed using test instructions and/or data 813. The automated testing procedure optionally includes loading partial test configuration bitstreams (PTCBs) 804 and 805. If the programmed PLD passes the automated testing procedure in a first fashion (e.g., returning a first set of test results), user configuration bitstream 824 is loaded into the PLD and the automated configuration procedure terminates, allowing the programmed PLD to function as determined by user configuration bitstream 824. If the programmed PLD passes the automated testing procedure in a second fashion (e.g., returning a second set of test results), user configuration bitstream 825 is loaded into the PLD and the automated configuration procedure terminates, allowing the programmed PLD to function as determined by user configuration bitstream 825.

In the pictured embodiment, user configuration bitstreams 824 and 825 are complete configuration bitstreams. This arrangement simplifies the procedure in view of the use of partial test configuration bitstreams 804 and 805 that might or might not have been loaded into the PLD. However, in some groups, memory devices, and data structures some of the test bitstreams and some of the user bitstreams are partial bitstreams. In other embodiments, all bitstreams are complete bitstreams, and partial configuration is not used. In other embodiments, all bitstreams are partial bitstreams.

Figure 9:
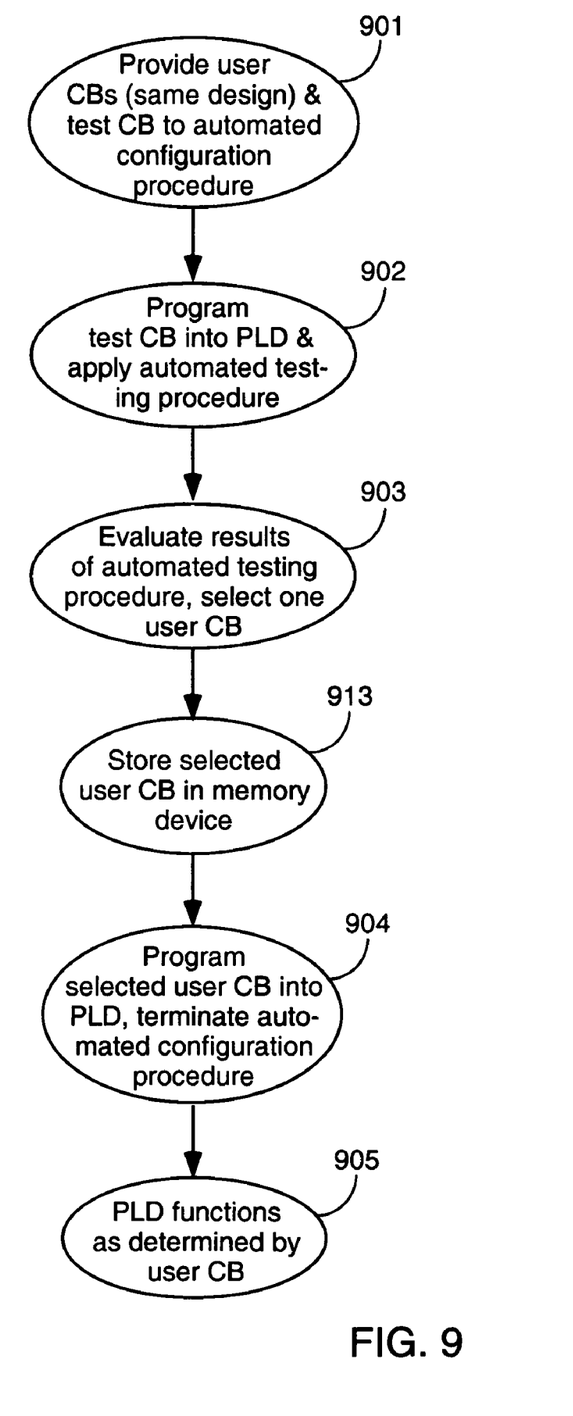
FIG. 9 illustrates the steps of a third method of programming a PLD that utilizes a plurality of configuration bitstreams implementing the same design.

In some embodiments, a single test configuration bitstream is used to test all of the user configuration bitstreams. For example, the single test bitstream can include all of the programmable resources used by any of the user bitstreams that were not previously tested in the factory. The results of the single test procedure are used to select one of the user configuration bitstreams for programming into the PLD. FIG. 9 illustrates the steps of one such method.

In step 901 of FIG. 9, two or more user configuration bitstreams (CBs) are provided that implement the same design in a PLD. Also provided is a single test configuration bitstream associated with each of the user configuration bitstreams. The test configuration bitstream is designed to facilitate testing the programmable resources in the PLD that are utilized by all of the user configuration bitstreams. In some embodiments, the test configuration bitstream is designed to facilitate testing all of the programmable resources used by the user configuration bitstreams. In other embodiments, the test configuration bitstream is designed to facilitate testing only those programmable resources used by the user configuration bitstreams that are not fully tested as part of the manufacturing process. In some embodiments, the test bitstream is designed to only detect defects in the interconnect resources of the PLD. In some embodiments, the test bitstream is designed to facilitate testing of other subsets of the programmable resources in the PLD that are utilized by the user configuration bitstreams. For example, the test bitstream can be designed to facilitate testing of those programmable resources most susceptible to fabrication defects.

The user configuration bitstreams and test configuration bitstream can be loaded into a memory device such as a programmable read only memory (PROM) or a computer readable medium (e.g., a disk drive, a floppy disk, and so forth). The memory device can then be coupled to a configuration port of the PLD. In some embodiments, test instructions and/or data values are also provided, as previously described.

Each of the user configuration bitstreams utilizes a different set of programmable resources in the PLD. The sets of programmable resources utilized by each user configuration bitstream can be overlapping, i.e., at least one of the programmable resources in the PLD can be included in at least two of the sets. Alternatively, the sets of programmable resources can be non-overlapping. In some embodiments, each of the user configuration bitstreams enables the design to meet a common set of predetermined timing constraints when programmed into a fully functional PLD.

In some embodiments, each of the programmable resources in the PLD is excluded from at least one of the sets. In some embodiments, no more than two percent of the programmable resources are included in all of the sets. In embodiments where each of the user bitstreams includes at least one common set of the programmable resources, the logic that utilizes the common set can optionally be implemented using triple modular redundancy (TMR).

In step 902, the test configuration bitstream is programmed into the PLD, and an automated testing procedure is applied to the programmed PLD. The PLD can be a partially defective PLD or a fully functional PLD. The automated testing procedure can be controlled, for example, by a configuration control circuit that forms a portion of the PLD (e.g., either programmed into the programmable logic or coded as transistor logic on the PLD die). In other embodiments, the automated testing procedure is controlled by a configuration control device external to the PLD. Test patterns exercised by the automated testing procedure can be similar, for example, to those previously described.

In step 903, the results of the automated testing procedure are evaluated. Based on the results of the automated testing procedure, one of the user configuration bitstreams is selected for the PLD. For example, user configuration bitstreams can be eliminated from consideration if test procedures exercising resources used in the bitstream have failed. After bitstreams including failed resources, any of the remaining user bitstreams can be selected. In some embodiments, the PLD is rejected PLD as unsuitable for implementing the design when the PLD programmed with the test configuration bitstream fails to pass the automated testing procedure.

In optional step 913, the selected user configuration bitstream is stored in a memory device (e.g., a PROM). Unused bitstreams, test bitstreams, and test data, if any, are not written to the memory device. Future configurations of the PLD can optionally by performed using standard methods to load the selected bitstream from the memory device, eliminating the need for repeatedly performing the automated configuration procedure illustrated in FIG. 9.

In step 904, the selected user configuration bitstream is programmed into the PLD and the automated configuration procedure illustrated in FIG. 9 is terminated. In step 905, the PLD assumes a predetermined function as determined by the selected user configuration bitstream. Steps 904 and 905 can be omitted if step 913 is performed.

In some embodiments, the test configuration bitstream and all of the user configuration bitstreams are complete bitstreams (reconfiguring the entire PLD). In other embodiments, at least one of the configuration bitstreams is a partial configuration bitstream. In some embodiments (e.g., where the configuration control circuit is programmed into the PLD), the test configuration bitstream includes the configuration control circuit or is a partial configuration bitstream that does not overwrite the configuration control circuit. In some embodiments, at least one of the user bitstreams is a partial bitstream, and some of the configuration data from the test bitstream is retained in the programmed PLD.

Those having skill in the relevant arts of the invention will now perceive various modifications and additions that can be made as a result of the disclosure herein. For example, the above text describes the methods and structures of the invention in the context of programmable logic devices (PLDs) such as field programmable gate arrays (FPGAs). However, the methods and structures of the invention can also be implemented utilizing other types of PLDs, e.g., CPLDs, PLAs, PALs, and so forth. The methods and structures of the invention can also apply to any integrated circuit (IC) that includes programmable resources, e.g., programmable interconnect devices such as communications ICs, switch fabric ICs, crossbar switch ICs, and so forth. Other ICs to which the invention can be applied include, for example, multiprocessor devices with a programmable switch fabric and ASIC devices or other ICs incorporating FPGA logic.

Accordingly, all such modifications and additions are deemed to be within the scope of the invention, which is to be limited only by the appended claims and their equivalents.

What is claimed is:

1. A method of programming an integrated circuit (IC) to implement a design, comprising:
    storing an initial configuration bitstream and a subsequent configuration bitstream, wherein the initial and subsequent configuration bitstreams are stored for programming programmable logic and programmable interconnect of the IC, and the initial and a subsequent configuration bitstreams are different and implement an equivalent function for the design;
    programming the initial configuration bitstream into the IC and applying an automated testing procedure to the IC that is programmed with the initial configuration bitstream;
    wherein the programming with the initial configuration bitstream is after the storing of both the initial and subsequent configuration bitstreams;
    programming, when the IC fails to pass the automated testing procedure, the subsequent configuration bitstream into the IC and applying the automated testing procedure to the IC that is programmed with the subsequent configuration bitstream; and
    when the IC passes the automated testing procedure, terminating the programming and allowing the IC to assume the equivalent function as determined by the subsequent configuration bitstream.

2. The method of claim 1, further comprising:
    selecting, based on results of the automated testing procedure, one of a plurality of available configuration bitstreams to be the subsequent configuration bitstream.

3. The method of claim 1, wherein the applying the automated testing procedure comprises programming at least a portion of the IC with additional configuration data.

4. The method of claim 1, further comprising:
    rejecting the IC as unsuitable for implementing the design when the IC is programmed with a final configuration bitstream and fails to pass the automated testing procedure.

5. The method of claim 1, further comprising:
    providing a plurality of configuration bitstreams to be used by the automated configuration procedure, wherein each configuration bitstream implements the design in the IC, and each configuration bitstream utilizes a different set of programmable resources in the IC.

6. The method of claim 5, wherein at least one of the programmable resources in the IC is included in at least two of the sets of programmable resources.

7. The method of claim 5, wherein each of the programmable resources in the IC is excluded from at least one of the sets of programmable resources.

8. The method of claim 5, wherein each of the plurality of configuration bitstreams includes a common set of the programmable resources, and wherein logic implemented by the common set is implemented in the design using triple modular redundancy.

9. The method of claim 5, wherein each configuration bitstream enables the design to meet a common set of predetermined timing constraints when programmed into a fully functional IC.

10. The method of claim 5, further comprising:
    storing the configuration bitstreams in a memory device; and
    coupling the memory device to a configuration port of the IC.

11. The method of claim 5, further comprising:
    providing a plurality of test data values, each test data value being associated with one of the configuration bitstreams.

12. The method of claim 11, wherein each test data value comprises data expected from the automated testing procedure when applied to a fully functional IC programmed with the associated configuration bitstream.

13. The method of claim 11, wherein the test data values comprise checksum values.

14. The method of claim 11, further comprising:
    storing the configuration bitstreams and the test data values in a memory device; and coupling the memory device to a configuration port of the IC.

15. The method of claim 1, wherein the applying the automated testing procedure comprises utilizing a configuration control circuit that forms a portion of the IC to control the automated testing procedure.

16. The method of claim 15, wherein the configuration control circuit utilizes JTAG INTEST to apply the automated testing procedure to the programmed IC.

17. The method of claim 1, wherein the applying the automated testing procedure comprises utilizing a configuration control circuit external to the IC to control the automated testing procedure.

18. The method of claim 17, wherein the configuration control circuit utilizes JTAG INTEST to apply the automated testing procedure to the programmed IC.

19. The method of claim 1, wherein the IC comprises a partially defective IC.

20. The method of claim 1, wherein the IC comprises a programmable logic device (PLD).

21. The method of claim 20, wherein the PLD comprises a field programmable gate array (FPGA).

22. The method of claim 1, wherein the programming the subsequent configuration bitstream into the IC comprises performing a partial reconfiguration of the IC.

23. A system, comprising:
means for storing an initial configuration bitstream and a subsequent configuration bitstream, wherein the initial and subsequent configuration bitstreams are stored for programming programmable logic and programmable interconnect of the IC, and the initial and a subsequent configuration bitstreams are different and implement an equivalent function for the design;
means for programming the initial configuration bitstream into an integrated circuit (IC) and programming, when the IC fails to pass an automated testing procedure, the subsequent configuration bitstream into the IC;
wherein the means for programming programs with the initial configuration bitstream after the storing of both the initial and subsequent configuration bitstreams;
means for applying the automated testing procedure to the IC; and
means for, when the IC passes the automated testing procedure, allowing the IC to assume the same predetermined function as determined by the subsequent configuration bitstream.

24. The structure of claim 23, wherein the structure comprises a programmable logic device (PLD).

* * * * *